(12) United States Patent
Basin et al.

(10) Patent No.: US 9,351,348 B2
(45) Date of Patent: May 24, 2016

(54) LAMINATE SUPPORT FILM FOR FABRICATION OF LIGHT EMITTING DEVICES AND METHOD OF FABRICATION

(75) Inventors: Grigoriy Basin, San Francisco, CA (US); Paul Scott Martin, Livermore, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/879,639

(22) PCT Filed: Oct. 20, 2011

(86) PCT No.: PCT/IB2011/054684
§ 371 (c)(1),
(2), (4) Date: Apr. 16, 2013

(87) PCT Pub. No.: WO2012/056378
PCT Pub. Date: May 3, 2012

(65) Prior Publication Data
US 2013/0221835 A1    Aug. 29, 2013

Related U.S. Application Data

(60) Provisional application No. 61/407,180, filed on Oct. 27, 2010.

(51) Int. Cl.
*H05B 33/02* (2006.01)
*H05B 33/10* (2006.01)
(Continued)

(52) U.S. Cl.
CPC ..... *H05B 33/02* (2013.01); *F21V 9/00* (2013.01); *H01L 25/0753* (2013.01);
(Continued)

(58) Field of Classification Search
CPC ..... H01L 33/507; H01L 33/62; H01L 33/502; H01L 33/58; H01L 33/504; H01L 2933/0033; H01L 21/00; H01L 23/00; H01L 25/00; H01L 27/00; H01L 21/0243; H01L 21/77; H01L 24/06; H01L 2933/0025; H01L 2933/0041; H01L 31/1892; H01L 25/075; H01L 25/0753; H01L 33/505; H01L 33/508; H01L 2924/00; H01L 2924/10253; H01L 2924/12042; H01L 2924/12043; H01L 2924/12041; H05B 33/10; H05B 33/20
USPC ............ 313/483; 257/88, 89; 438/21, 22
See application file for complete search history.

(56) References Cited

U.S. PATENT DOCUMENTS 4,007,396 A    2/1977  Wisbey et al.
8,141,384 B2 *  3/2012  Barnes et al. .......... 65/17.3
(Continued)

FOREIGN PATENT DOCUMENTS

EP    2120271 A1    11/2009
JP    2005-183777 A    7/2005
(Continued)

OTHER PUBLICATIONS

Office Action dated Dec. 10, 2015 from ROC (Taiwan) Application No. 100139214.
(Continued)

*Primary Examiner* — Vip Patel

(57) ABSTRACT

Optical elements (130) are attached to a support film (110) at select locations, the select locations corresponding to locations of light emitting elements (140) on another substrate, e.g. the substrate of the title (150). The film is placed on the substrate containing the light emitting elements such that the optical elements are in contact with their corresponding light emitting elements. The optical elements are laminated to the light emitting elements, and the support film is removed. The optical elements may include wavelength conversion elements, lens elements, combinations of elements, and so on. Other elements, such as conductors and reflectors may also be positioned on the laminate film.

20 Claims, 4 Drawing Sheets

(51) Int. Cl.
*H01L 25/075* (2006.01)
*F21V 9/00* (2015.01)
*H01L 33/50* (2010.01)
*H01L 33/58* (2010.01)
*H01L 33/62* (2010.01)

(52) U.S. Cl.
CPC ............ *H05B 33/10* (2013.01); *H01L 33/50* (2013.01); *H01L 33/58* (2013.01); *H01L 33/62* (2013.01); *H01L 2224/24* (2013.01); *H01L 2933/0041* (2013.01); *H01L 2933/0058* (2013.01); *Y10T 428/2486* (2015.01); *Y10T 428/24802* (2015.01); *Y10T 428/24926* (2015.01)

(56) References Cited

U.S. PATENT DOCUMENTS

| | | | |
|---|---|---|---|
| 8,669,573 B2* | 3/2014 | Medendorp, Jr. | 257/98 |
| 8,759,123 B2* | 6/2014 | Wada et al. | 438/27 |
| 2006/0102914 A1* | 5/2006 | Smits et al. | 257/98 |
| 2007/0096131 A1 | 5/2007 | Chandra | |
| 2007/0267646 A1 | 11/2007 | Wierer, Jr. et al. | |
| 2009/0001869 A1 | 1/2009 | Tanimoto et al. | |
| 2009/0020779 A1* | 1/2009 | Yamada et al. | 257/100 |
| 2009/0053528 A1* | 2/2009 | Okuya et al. | 428/421 |
| 2009/0154166 A1 | 6/2009 | Zhang et al. | |
| 2009/0173960 A1 | 7/2009 | Martin et al. | |
| 2010/0051984 A1 | 3/2010 | West | |
| 2010/0109025 A1* | 5/2010 | Bhat | 257/88 |
| 2010/0295077 A1* | 11/2010 | Melman | 257/98 |
| 2011/0018011 A1* | 1/2011 | Beeson et al. | 257/89 |
| 2011/0058372 A1* | 3/2011 | Lerman et al. | 362/235 |

FOREIGN PATENT DOCUMENTS

| | | |
|---|---|---|
| JP | 2006-165326 A | 6/2006 |
| JP | 2007-019096 A | 1/2007 |
| TW | 201019395 A | 5/2010 |
| WO | 2007146860 A1 | 12/2007 |
| WO | 2010027672 A2 | 3/2010 |
| WO | 2012023119 A1 | 2/2012 |

OTHER PUBLICATIONS

International Search Report mailed Feb. 12, 2012 from International Application No. PCT/IB2011/054684, 13 pgs.

Office Action issued Aug. 4, 2015 from Japanese Application No. 2013-535553.

* cited by examiner

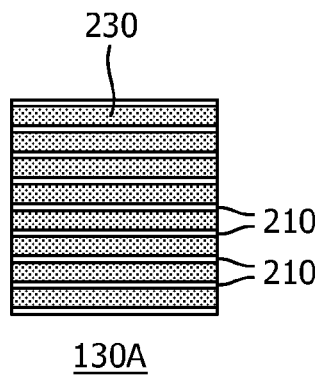
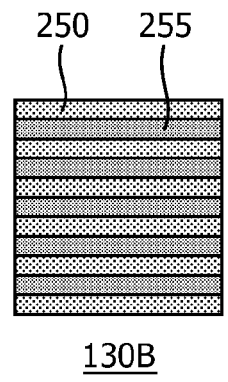
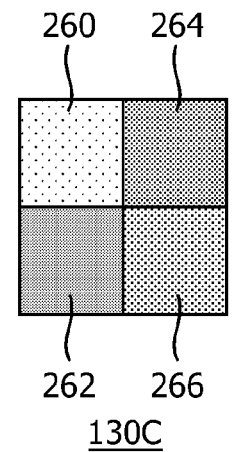
FIG. 2A  FIG. 2B  FIG. 2C
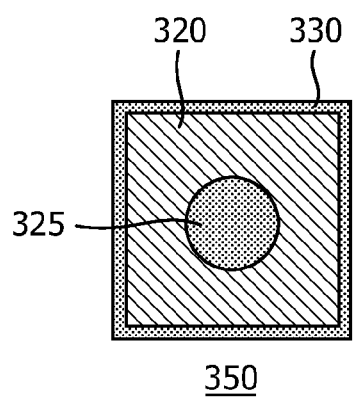
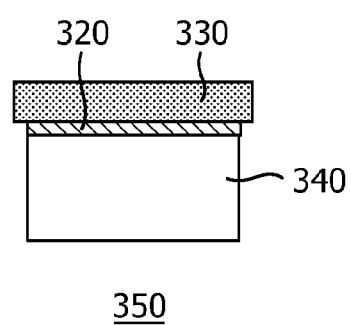
FIG. 3A  FIG. 3B

LAMINATE SUPPORT FILM FOR FABRICATION OF LIGHT EMITTING DEVICES AND METHOD OF FABRICATION

FIELD OF THE INVENTION

This invention relates to the field of light emitting devices, and in particular to a patterned lamination sheet and corresponding structures and devices formed by such a sheet.

BACKGROUND OF THE INVENTION

U.S. patent publication 2009/0173960 "SEMICONDUCTOR LIGHT EMITTING DEVICE WITH PRE-FABRICATED WAVELENGTH CONVERSION ELEMENT", published 9 Jul. 2009 for Martin et al. and incorporated by reference herein, discloses a semiconductor light emitting device with a separately fabricated wavelength converting element. The wavelength converting element, of e.g., phosphor and glass, is produced in a sheet that is separated into individual wavelength converting elements that are bonded to light emitting devices. The wavelength converting elements may be grouped and stored according to their wavelength converting properties. The wavelength converting elements may be selectively matched with a semiconductor light emitting device, to produce a desired mixture of primary and secondary light.

SUMMARY OF THE INVENTION

It would be advantageous to simplify or reduce the costs associated with the process used to produce light emitting devices with wavelength conversion elements, or other elements that are added to the underlying light emitting structure.

Optical elements are attached to a flexible support film at select locations, the select locations corresponding to locations of light emitting elements on a separate substrate. The film is placed on the substrate containing the light emitting elements such that the optical elements are in contact with their corresponding light emitting elements. The optical elements are laminated to the light emitting elements, and the support film may be removed. The optical elements may include wavelength conversion elements, lens elements, combinations of elements, and so on. Other elements, such as metal conductors may also be positioned on the laminate film.

BRIEF DESCRIPTION OF THE DRAWINGS

The invention is explained in further detail, and by way of example, with reference to the accompanying drawings wherein:

FIGS. 2A-2C illustrate example patterned optical elements.

FIGS. 3A-3B illustrate an example multilayer optical element.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

The aforementioned published application discloses at least two techniques for adding optical elements, in this case wavelength conversion elements (e.g. phosphor) to light emitting elements. In a first technique, a sheet of phosphor material is placed over a substrate that contains multiple light emitting elements, then processed to attach the phosphor material to the light emitting elements. Using this technique, the entire substrate is covered by the phosphor material. In a second technique, the sheet of phosphor material is cut into individual elements, and the individual elements are attached to the light emitting portion of the light emitting elements, thereby conserving the amount of phosphor being used. A pick-and-place process may be used to place each of the phosphor elements upon each light emitting element.

Figure 1A:
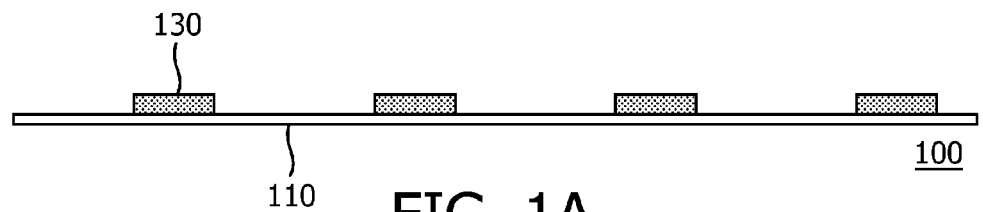
FIGS. 1A-1E illustrates an example formation of a laminate arrangement of optical elements and light emitting devices.
Figure 1B:
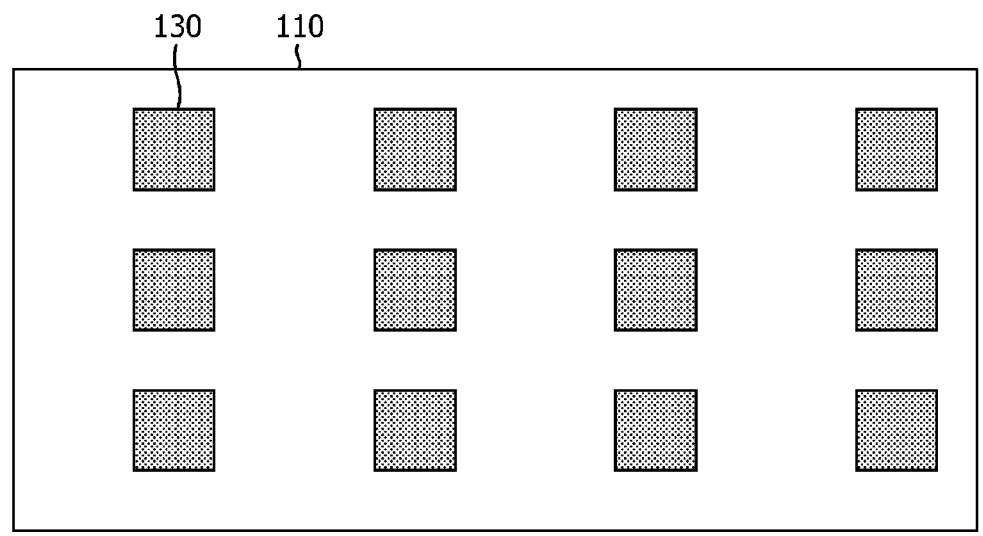
Figure 1C:
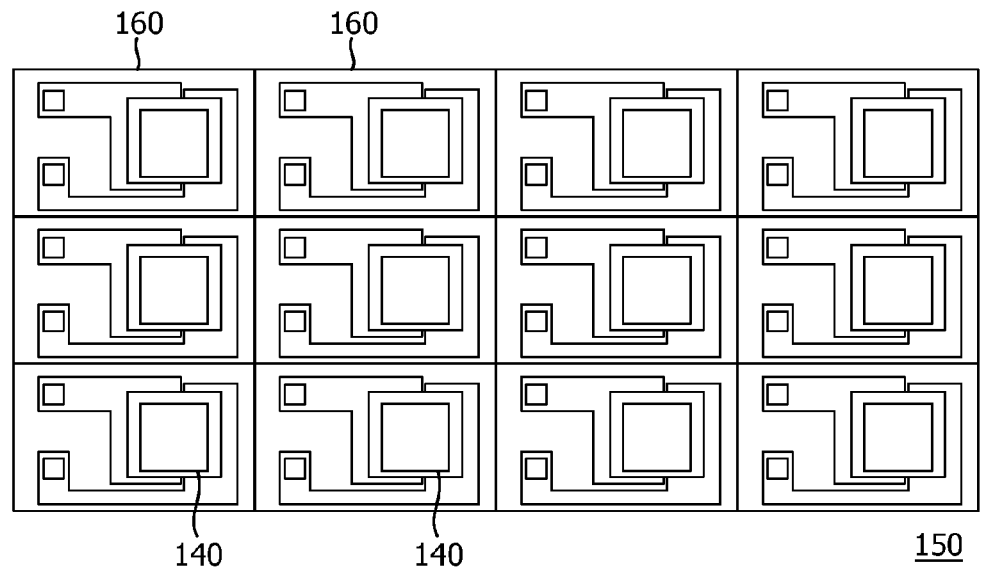

FIGS. 1A-1E illustrate formation of an example laminate structure 190. FIG. 1A illustrates a cross section view of a laminate film 100; FIG. 1B illustrates a surface view of the laminate film 100; and FIG. 1C illustrates an example tile 150 of light emitting devices before they are sliced/diced or otherwise singularized into individual light emitting devices 160. As the term is used herein, a 'tile' is merely a plurality of devices on a substrate; the tile may be a semiconductor wafer upon which the devices are formed, a frame with receptacles within which the devices are placed, or any other substrate upon which the devices are located.

The laminate film 100 of this example includes a plurality of optical elements 130 that are positioned at select locations on a flexible support film 110, producing variations in elevation, or profile, normal to the surface of the support film. The locations are selected such that, when the laminate film 100 is inverted and placed upon the tile 150 of light emitting devices 160, the optical elements 130 will be located upon a particular feature 140 of the light emitting devices 160. For example, if the optical elements 130 include a wavelength converting material, such as phosphor, they may be situated on the support film 110 at locations corresponding to the light emitting elements of the light emitting devices 160 on the tile 150.

Figure 1D:
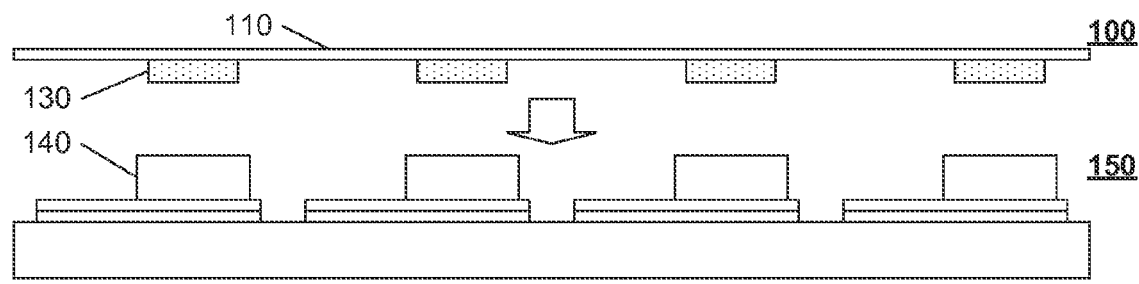
Figure 1E:
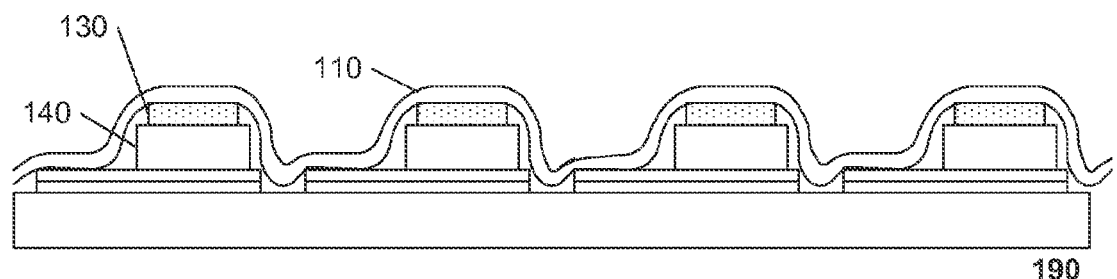

When the laminate film 100 is inverted and placed upon the tile 150, as illustrated in FIG. 1D, a heat and vacuum lamination process may be used to attach the optical elements 130 to their corresponding feature 140, to form a laminate structure as illustrated in FIG. 1E. That is, the laminate film 100 may be drawn down upon the tile 150 using a vacuum, and heated so that the optical element 130 bonds with the corresponding feature 140 of the light emitting device 160. Thereafter, the support film 110 may be removed, and any subsequent processing of the light emitting devices 160 with optical elements 130 may be performed.

In an example embodiment, the support film 110 may be an ethylene tetra fluoro ethylene (ETFE) film that has relatively low adhesion to the optical element 130. The optical element 130 may be a glass or epoxy element with a higher adhesion to the feature 140 of the light emitting device 160. WO 2012/023119 "LAMINATION PROCESS FOR LEDS", published 23 Feb. 2012 for Grigoriy Basin and Kazutoshi Iwata, discloses a method for laminating a layer of, for example, phosphor powder in a silicone binder, over an array of LED dies on a submount wafer, and is incorporated by reference herein. The layer is mounted over the LED dies, and the structure is heated in a vacuum. Downward pressure is placed on the support film so that the layer adheres to the tops of the LED dies. The structure is then exposed to ambient air, and the support film is removed. In a second lamination step, the structure is heated to a higher temperature in a vacuum to remove the remaining air between the layer and the wafer.

The optical elements 130 may be formed or placed on the support film 110 using any of a variety of techniques. An embossing process or screen printing may be used to stamp or print the optical elements 130 upon the support film; a photo-lithograph process may be used to form the optical elements 130 upon the support film; a pick-and-place process may be used to place the optical elements 130 upon the support film; or a combination of these and other techniques known in the art may be used. An embossing or other 'casting' technique may be used to create a desired pattern in the optical elements 130. Depending upon the processes and materials used, the pattern could be formed directly upon the optical elements 130, or the support film 111 could contain a pattern that is subsequently adopted by the optical elements 130.

If the resultant laminate film 100 is to be stored for future lamination to a tile 150, a removable cover film may be placed over the optical elements 130, opposite the support film 110, to avoid contamination or damage to the optical elements 130. In this regard, the terms 'support film' and 'cover film' may be interpreted to be equivalent. For example, if the elements 130 are sandwiched between the original film upon which the elements 130 are formed and another film that covers the elements 130, it may be immaterial which film is removed to expose the elements 130, the remaining film thereafter being the support film.

Figure 1F:
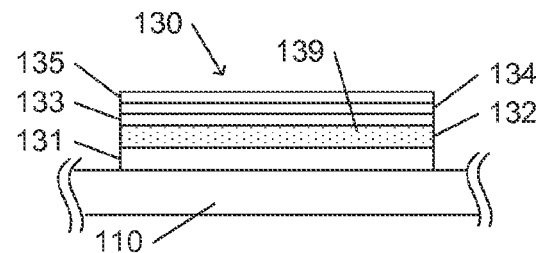
FIG. 1F illustrates a laminate film including a lens element, phosphor elements, electrically conductive layers, and thermally conductive layers.

The laminate film 100 is not limited to a single type of optical element 130. The optical element 130 may comprise multiple elements and structures. For example, as illustrated in FIG. 1F, a lens element 131 may be formed on the laminate film 110, followed by phosphor elements 132 on the lenses 131, followed by reflectors 134 formed around the phosphor elements. In like manner, circuit traces 135 may be formed as one or more electrically conductive lamination layers in the laminate film 100. Similarly, one or more thermal conductive lamination layers 133 may be formed in the laminate film 100 to facilitate the transfer or dissipation of heat produced within the device, or the other layers, such as a phosphor wavelength conversion layer. The thermal conductive layer 133 may be selected to have optical properties similar to adjacent layers, or thermal conductive material 139 may be embedded within an 'existing' layer, such that the layer performs its primary function as well as the function of thermal transfer. For example, if a silicone/phosphor polymer is used for wavelength conversion, silica may be added to the polymer to provide better thermal transfer; because silica has a refraction index similar to silicone, the addition of silica is not likely to reduce the optical quality of the device.

FIGS. 2A-2C illustrate surface views of example optical elements 130A-130C. In FIG. 2A, the example optical element 130A is patterned 210 to perhaps form a particular optical pattern or characteristic, such a collimation, polarization, dispersion, and so on. This patterning 210 may be created by forming the surface of the optical element 130A with the pattern, using, for example, a patterned laminate film 100 to transform the pattern to the optical material 230 during the lamination process. Alternatively, the pattern 210 could be formed by applying a second material, such as metal, to the support film in the desired pattern, then covering this material with the optical material 230. Other techniques for creating a patterned surface are well known in the art.

In FIGS. 2B and 2C, different types of material form the optical elements 130B and 130C, as illustrated by the different shadings. In FIG. 2B, the two different materials 250, 255, such as two different phosphors are arranged in an alternating pattern. Such a combination may be used, for example, when a broader spectrum of output light is desired, by converting the originally emitted light into light of two other wavelengths. This concept may be extended to include any number of combinations, a combination of four phosphors 260, 262, 264, 266 being illustrated in FIG. 2C.

FIGS. 3A-3B illustrate a surface and cross-cut view of an optical element 350 that includes a phosphor 330 and a reflector 320. The reflector 320 may be a metal or dielectric layer that is applied atop the phosphor 330. The reflector 320 includes an opening 325 that permits light from the light emitting element in the light emitting device 340 to enter the phosphor layer 330. Although illustrated as being smaller than the phosphor layer 330, the reflector 320 may extend beyond the phosphor layer 330.

Figure 4:
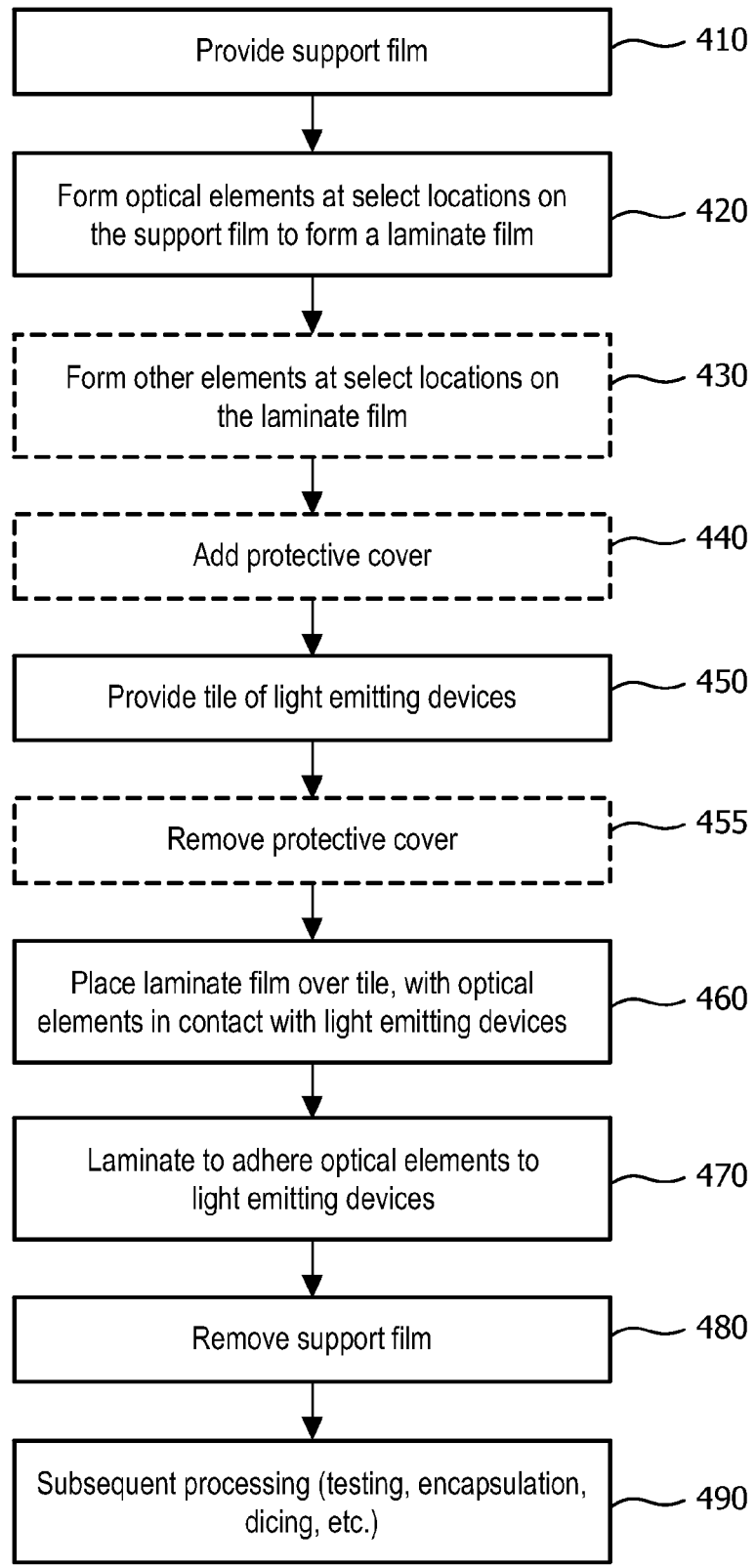
FIG. 4 illustrates an example flow diagram for forming a laminate arrangement of optical elements and light emitting devices.

FIG. 4 illustrates an example flow diagram for formation of a laminate structure with optical elements and light emitting devices.

At 410, a support film is provided. As noted above, the support film may be an ethylene tetra fluoro ethylene (ETFE) film with low adhesion. Upon this film, discrete optical elements are placed or formed at select locations, at 420. These locations are selected to correspond to locations of features of light emitting devices on a separate substrate, such as the location of the light emitting element in each light emitting device. As also noted above, these optical elements may be embossed or printed on the support film, or formed using photo-lithographic techniques. The optical elements may include phosphors in an epoxy or glass slurry that is subsequently cured, or partially cured upon the support film to form a laminate film. Other elements, which may be additional parts of the discrete optical elements, may also be added to the laminate film, at 430.

Optionally, at 440, a protective cover film may be added to the laminate film, opposite the support film. This cover film may also be an ETFE film with low adhesion.

At 450, the tile of light emitting devices is provided, and at 455, the protective cover, if any, may be removed. If a protective cover film had been added, and depending on the particular structure of the optical element, either the original film or this cover film may subsequently be considered the support film; the support film being the film remaining after the other film is removed.

The laminate film is placed upon the tile such that the optical elements are in contact with the corresponding feature of the light emitting devices, at 460. The laminate film is then laminated to the light emitting devices, at 470. Lamination may be performed using a vacuum and heating process, as detailed above, or, any alternative lamination technique may be used. The resultant laminate structure may be stored for subsequent processing, the support film forming a protective cover for this structure.

At 480, the support film may be removed and any remaining processes may be performed, at 490, such as testing, encapsulation, singularizing, and so on.

While the invention has been illustrated and described in detail in the drawings and foregoing description, such illustration and description are to be considered illustrative or exemplary and not restrictive; the invention is not limited to the disclosed embodiments. For example, it is possible to operate the invention in an embodiment wherein the variations in profile of one layer are compensated by other layers, to provide a substantially uniformly thick laminated film, but at least one of the patterned layers will provide a variation in elevation of that layer with respect to the support film.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. Any reference signs in the claims should not be construed as limiting the scope.

We claim:

1. A method comprising:
    providing a flexible support film, and
    adding one or more layers to a surface of the film, in accordance with a pattern, to form at least a plurality of discrete optical elements, the pattern resulting in variations in elevation of at least one layer normal to the surface of the support film, wherein the pattern corresponds to an arrangement of light emitting devices on a separate substrate,
    placing the flexible support film with the plurality of discrete optical elements upon the light emitting elements on the separate substrate, without an adhesive,
    applying a vacuum to draw the support film that is between the discrete optical elements toward the separate substrate, thereby applying a force that urges the discrete optical elements upon the light emitting devices,
    heating the laminate to attach the discrete optical elements to the light emitting devices, and
    removing the support film, leaving the plurality of optical elements attached to the plurality of light emitting devices.

2. The method of claim 1, wherein the optical elements include wavelength converting elements.

3. The method of claim 1, wherein the one or more layers includes a layer of electrically conductive elements.

4. The method of claim 1, wherein the one or more layers includes material that enhances thermal conduction.

5. The method of claim 1, wherein the one or more layers includes a layer of reflective material.

6. The method of claim 1, wherein each optical element includes a plurality of phosphor elements.

7. A laminate film comprising:
    a flexible support film, and
    one or more laminated layers upon the support film, at least one of the layers including a plurality of discrete optical elements situated on the support film in accordance with a pattern corresponding to locations of light emitting devices on a separate substrate, the pattern resulting in variations in elevation of the at least one layer normal to the surface of the support film,
    wherein:
    the discrete optical elements have a substantially higher vacuum lamination adhesion factor than the support film, and
    the plurality of discrete optical elements are adhered to the surface of the support film with a low adhesion that enables the support film to be removed from the plurality of optical elements without damage to the optical elements after the plurality of discrete optical elements are vacuum laminated to the plurality of light emitting devices without the use of an adhesive layer.

8. The laminate film of claim 7, including a cover film layer that covers the plurality of optical elements, opposite the support film.

9. The film of claim 7, wherein the optical elements include wavelength converting elements.

10. The film of claim 7, wherein the optical elements include phosphor-glass elements.

11. The film of claim 7, wherein each of the optical elements includes a plurality of phosphor elements.

12. The film of claim 7, wherein at least one of the layers includes a layer of conductive elements, the conductive elements including at least one of electrically conductive elements or thermal conductive elements.

13. The film of claim 7, wherein at least one of the layers includes a layer of reflective material.

14. A laminate structure comprising:
    a tile that includes a plurality of light emitting devices, and
    a laminate film that includes:
        a flexible support film and
        a plurality of discrete optical elements that are situated on a surface of the support film at locations corresponding to locations of the plurality of light emitting devices on the tile, the optical elements forming an irregular profile that includes variations in elevation normal to the surface of the support film,
    wherein:
    the discrete optical elements have substantially higher vacuum lamination adhesion factor than the support film, and
    the plurality of discrete optical elements are adhered to the surface of the support film with a low adhesion that enables the support film to be removed from the plurality of optical elements without damage to the optical elements after the plurality of optical elements are vacuum laminated to the plurality of light emitting devices without the use of an adhesive layer.

15. The structure of claim 14, wherein the optical elements include wavelength converting elements.

16. The structure of claim 14, wherein each of the optical elements includes a plurality of phosphor elements.

17. The structure of claim 14, wherein at least one of the layers includes at least one of: an electrically conductive layer, a thermal conductive layer, a reflective layer, and a cover layer.

18. The method of claim 1, wherein the support film comprises an ethylene tetra fluoro ethylene (ETFE) film.

19. The film of claim 7, wherein the support film comprises an ethylene tetra fluoro ethylene (ETFE) film.

20. The structure of claim 14, wherein the support film comprises an ethylene tetra fluoro ethylene (ETFE) film.

* * * * *